US009758367B2

(12) United States Patent
Kaanta

(10) Patent No.: US 9,758,367 B2
(45) Date of Patent: Sep. 12, 2017

(54) METALLIZING MEMS DEVICES

(71) Applicant: Analog Devices, Inc., Norwood, MA (US)

(72) Inventor: Bradley C. Kaanta, Belmont, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/963,998

(22) Filed: Dec. 9, 2015

(65) Prior Publication Data

US 2017/0166439 A1 Jun. 15, 2017

(51) Int. Cl.
H01L 23/02 (2006.01)
B81B 7/00 (2006.01)
B81C 1/00 (2006.01)

(52) U.S. Cl.
CPC .......... B81B 7/0006 (2013.01); B81C 1/0015 (2013.01); *B81B 2203/0118* (2013.01)

(58) Field of Classification Search
None
See application file for complete search history.

(56) References Cited

U.S. PATENT DOCUMENTS

| 5,028,565 A | 7/1991 | Chang et al. ................. 437/192 |
| 5,077,236 A | 12/1991 | Kim ............................... 437/192 |
| 5,202,287 A | 4/1993 | Joshi et al. .................... 437/192 |
| 5,376,585 A | 12/1994 | Lin et al. ...................... 437/192 |
| 5,795,824 A | 8/1998 | Hancock ....................... 438/656 |
| 5,874,360 A | 2/1999 | Wyborn et al. ............... 438/680 |
| 6,048,792 A | 4/2000 | Watanabe et al. ............ 438/656 |
| 6,054,172 A | 4/2000 | Robinson et al. ............. 427/97 |
| 6,274,472 B1 | 8/2001 | Hossain et al. ............... 438/598 |
| 6,287,964 B1 | 9/2001 | Cho .............................. 438/643 |
| 6,380,083 B1 | 4/2002 | Gross ........................... 438/687 |
| 6,500,760 B1 * | 12/2002 | Peterson ................ H01L 24/29 257/E21.518 |
| 6,531,341 B1 * | 3/2003 | Peterson .............. B81B 7/0067 257/680 |
| 6,946,716 B2 | 9/2005 | Andricacos et al. ......... 257/508 |
| 6,956,283 B1 * | 10/2005 | Peterson .............. B81B 7/0025 257/680 |
| 7,094,614 B2 | 8/2006 | Armbrust et al. ............. 438/14 |
| 7,580,172 B2 | 8/2009 | Lewis et al. .................. 359/245 |

(Continued)

FOREIGN PATENT DOCUMENTS

| JP | 06029237 A | 2/1994 | ............ H01L 21/28 |
| KR | 20010046339 A | 6/2001 | ............ H01L 21/28 |

OTHER PUBLICATIONS

Kotani et al., Abstract of: "A highly reliable selective CVD-W utilizing SiH4 reduction for VLSI contacts," Electron Devices Meeting, International vol. 33, IEEE, pp. 217-220, 1987.

(Continued)

*Primary Examiner* — Thao P Le

(74) *Attorney, Agent, or Firm* — Wolf, Greenfield & Sacks, P.C.

(57) ABSTRACT

Various embodiments produce a semiconductor device, such a MEMS device, having metallized structures formed by replacing a semiconductor structure with a metal structure. Some embodiments expose a semiconductor structure to one or more a reacting gasses, such as gasses including tungsten or molybdenum.

39 Claims, 14 Drawing Sheets

(56) References Cited

U.S. PATENT DOCUMENTS

| | | | |
|---|---|---|---|
| 8,399,351 B2 | 3/2013 | Takahashi | 438/637 |
| 2002/0141690 A1* | 10/2002 | Jin | G02B 6/352 385/18 |
| 2004/0016995 A1* | 1/2004 | Kuo | B81C 1/0023 257/678 |
| 2004/0227201 A1* | 11/2004 | Borwick, III | B81C 1/00238 257/414 |
| 2007/0013052 A1* | 1/2007 | Zhe | B81C 1/00309 257/704 |
| 2007/0258123 A1* | 11/2007 | Xu | G02B 26/001 359/245 |
| 2009/0004848 A1 | 1/2009 | Kim et al. | H01L 21/4763 |
| 2009/0246373 A1 | 10/2009 | Tachibana et al. | 427/255.23 |

OTHER PUBLICATIONS

Orij et al., "Modelling of the Deposition of Molybdenum on Silicon from Molybdenum Hexafluoride and Hydrogen," Journal de Physique IV, 1995, 05 (C5), pp. C5-331-C5-338.
Rosler et al., "Tungsten chemical vapor deposition characteristics using SiH4 in a single wafer system," Journal of Vacuum Science & Technology B6.6, pp. 1721-1727, 1988.
Mani et al., "W-coating for MEMS," Sandia National Laboratories, Albuquerque, NM, 10 pages, 1999.
Mani et al., "Effect of W coating on Microengine Performance," Sandia National Laboratories, Albuquerque, NM, 8 pages, 2000.
Pandey et al., "Effect of metal coating and residual stress on the resonant frequency of MEMS resonators," Sādhanā, vol. 34, Part 4, pp. 651-661, Aug. 2009, Printed in India.

\* cited by examiner

METALLIZING MEMS DEVICES

TECHNICAL FIELD

The present invention relates to semiconductor devices, and more particularly to electrical interconnections of semiconductor devices.

BACKGROUND ART

It is known in the semiconductor arts to electrically connect locations or features of a semiconductor device using doped semiconductor regions. However, such doped semiconductor regions sometimes have high sheet resistance. High sheet resistance, in turn, may result in high signal-path resistance, which may result in high resistance (hundreds or thousands of ohms) for a signal path, thereby creating significant thermal resistance noise, for example. In some applications, resistance in the signal path is becoming a limiting factor in noise performance in semiconductor devices.

SUMMARY OF THE EMBODIMENTS

In accordance with one embodiment, a method of fabricating a micromachined device having a metal interconnection structure begins with fabricating a substrate having at least one semiconductor interconnection structure at a surface of the substrate, the semiconductor interconnection structure having an electrical resistance. The method also includes a step or steps of fabricating a micromachined structure on the substrate. After fabricating the micromachined structure, the method includes replacing the semiconductor interconnection structure with a conductive metal interconnection structure having an electrical resistance that is lower than the electrical resistance of the semiconductor interconnection structure. Some embodiments including releasing the micromachined structure prior to replacing the semiconductor interconnection structure, such that the micromachined structure is movable relative to the substrate and remains movable relative to the substrate during the process of replacing the semiconductor interconnection structure. In addition, some embodiments include covering the conductive metal interconnection structure with passifying layer.

Replacing the semiconductor interconnection structure with a conductive metal interconnection structure produces a conductive metal interconnection structure has a sheet resistance of less than 20 Ω/sq. Indeed, in some embodiments, the conductive metal interconnection structure has a sheet resistance of less than 15 Ω/sq., 10 Ω/sq., 5 Ω/sq., or in some embodiments, even less than 1 Ω/sq.

In some embodiments, replacing a portion of the semiconductor interconnection structure with a conductive metal interconnection structure includes forming a seed layer of metal on the semiconductor interconnection structure, such that semiconductor atoms within the semiconductor interconnection structure are replaced by metal.

In various embodiments, replacing the semiconductor interconnection structure with a conductive metal interconnection structure includes exposing the semiconductor interconnection structure to a reacting gas. Such gases may include, for example, a gas including tungsten, and the conductive metal interconnection structure includes tungsten. For example, the reacting gas may include $WF_6$. In some embodiments, the reacting gas may include $SiH_4$, $H_2$, or $SiH_4$ and $H_2$. Alternately, the reacting gas may include, for example, molybdenum in a form such as $MoF_6$. In some embodiments, the reacting gas could also include $SiH_4$, $H_2$, or $SiH_4$ and $H_2$.

Beneficially, some embodiments replace the semiconductor interconnection structure, with a conductive metal interconnection structure, at a temperature of less than 500 degrees Celsius, and in some embodiments at less than 300 degrees Celsius.

Other embodiments include a method of fabricating a micromachined device, including providing a substrate, and fabricating a micromachined structure on the substrate, and then metallizing the micromachined structure. In some embodiments, the micromachined structure is movable with respect to the substrate during metallizing the micromachined structure.

Some embodiments metallize a single surface of the micromachined structure, while other embodiments, such as devices in which the micromachined structure is a beam of a MEMS device for example, metallize two, three, or four sides of the beam.

Some embodiments metallize the micromachined structure by initially forming a seed layer of metal on the micromachined structure, in which semiconductor atoms within the micromachined structure are replaced by metal. Some embodiments follow by adding at least one additional layer of the metal over the seed layer.

Some embodiments also include at least one semiconductor interconnection structure. In such embodiments, the method of fabrication may include, prior to metallizing the micromachined structure: fabricating at least one semiconductor interconnection structure at a surface of the substrate; and then simultaneously metallizing the at least one semiconductor interconnection structure to form a conductive metal interconnection structure, and metallizing the micromachined structure.

Finally, some embodiments of devices include a passifying layer covering the at least on conductive metal interconnection structure. Embodiments of methods of fabricating such devices further include covering the conductive metal interconnection structure with passifying layer.

Devices, in some embodiments, include a substrate having a surface, and a movable MEMS structure movably suspended from the substrate, as well as a metallized interconnection structure at the surface of the substrate, the metallized interconnection structure comprising a tungsten-infused semiconductor and having a sheet resistance of less than 20 Ω/sq. Indeed, in some embodiments, the metallized metal interconnection structure has a sheet resistance of less than 15 Ω/sq., 10 Ω/sq., 5 Ω/sq., or in some embodiments, even less than 1 Ω/sq. In some devices, the movable MEMS structure includes at least one surface of tungsten.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

Some embodiments increase the mass of movable MEMS structures to improve the inertial performance and/or electrical performance of those structures. In addition, some embodiments provide electrically conductive interconnection structures on semiconductor substrates that have significantly lower electrical resistance than doped semiconductor interconnections. In some embodiments, a chemical reaction replaces a previously-fabricated semiconductor interconnection structure, such as a doped silicon trace, for example, with a low-resistance metal trace, such as a tungsten trace. For example, some embodiments expose a semiconductor structure to one or more a reacting gasses, such as gasses including tungsten.

Figure 1A:
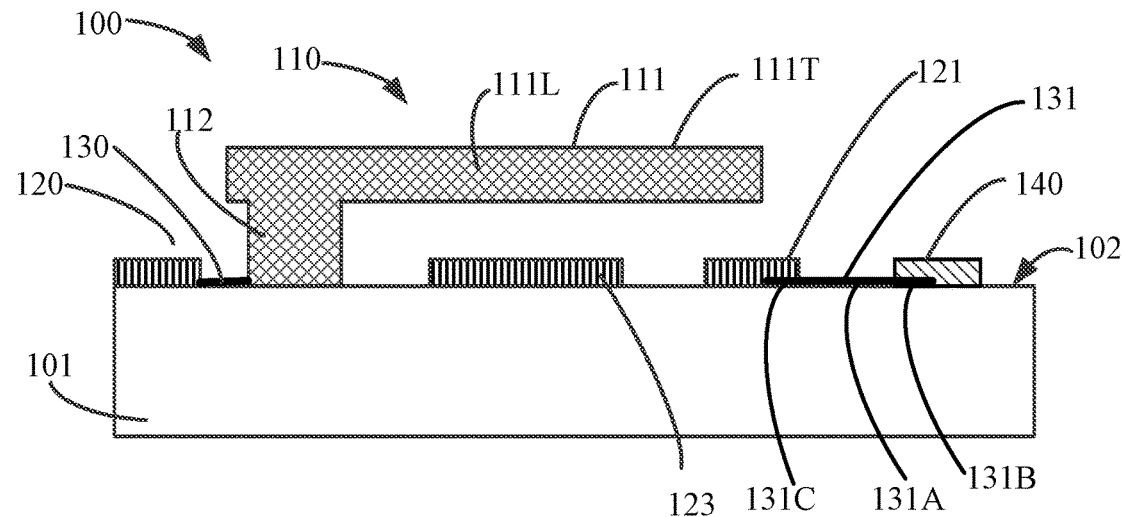
FIGS. 1A and 1B schematically illustrate a micromachined structure according to one embodiment.
Figure 1B:
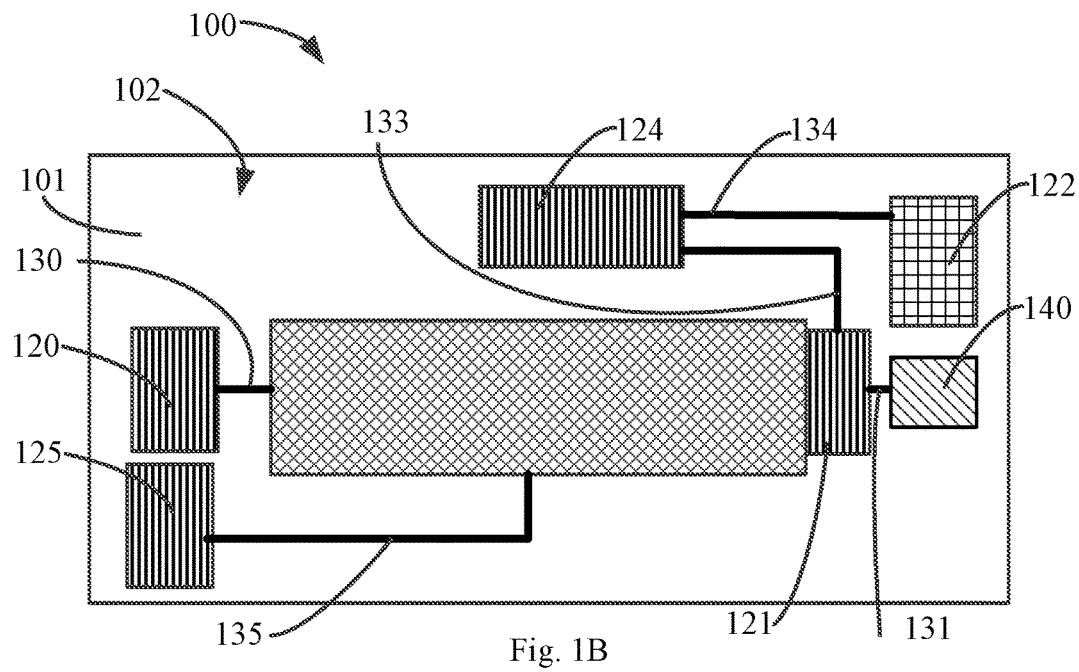

FIG. 1A and FIG. 1B schematically illustrate an embodiment of a micromachined device 100 (sometimes referred-to as a "MEMS" device) having a MEMS structure (which may be referred to as a "micromachined structure") 110 suspended from a substrate 101. In this example, the MEMS structure includes a cantilevered arm 111 coupled to the substrate 101 by an anchor 112, and may be a switch, or an accelerometer, for example.

The MEMS device 100 also includes several electrical contacts 120 as known in the art for connection bonding wires. In a switch embodiment, the device 100 includes an electrical contact 121 that physically contacts the cantilevered arm 111 when the arm 111 is deflected towards the substrate 101, for example by electrostatic force from electrode 123. Some embodiments also include integrated circuitry 122, which may include active devices (e.g., transistors), control circuits, or signal processing circuits, to name but a few examples.

The features of the device 110 are interconnected by conductive traces (or interconnections) (e.g., 130, 131) on, or integrated into, the surface 102 of the substrate 101. For example, trace 130 electrically couples contact 120 to the MEMS structure 110, and trace 131 electrically couples contact 121 with structure 140. Similarly, trace 133 electrically couples contact 121 with contact 124, and trace 134 electrically couples contact 124 with integrated circuitry 122.

Some of the traces are exposed on or in a surface 102 of substrate 101 for their entire length. Other traces have a portion of their length covered by other features. For example, trace 131 electrically connects electrode 121 and structure 140. A portion 131A trace 131 is exposed, although another portion 131B of the trace is covered by another structure 140, and although another portion 131C of the trace is covered by electrode 123.

Another trace 135 electrically couples contact 125 with electrode 123. In this embodiment, at least a portion of trace 135 is beneath the MEMS structure 110, in that a portion of trace 135 is disposed between the substrate 101 and the cantilevered arm 111.

Methods of Fabrication

Figure 2A:
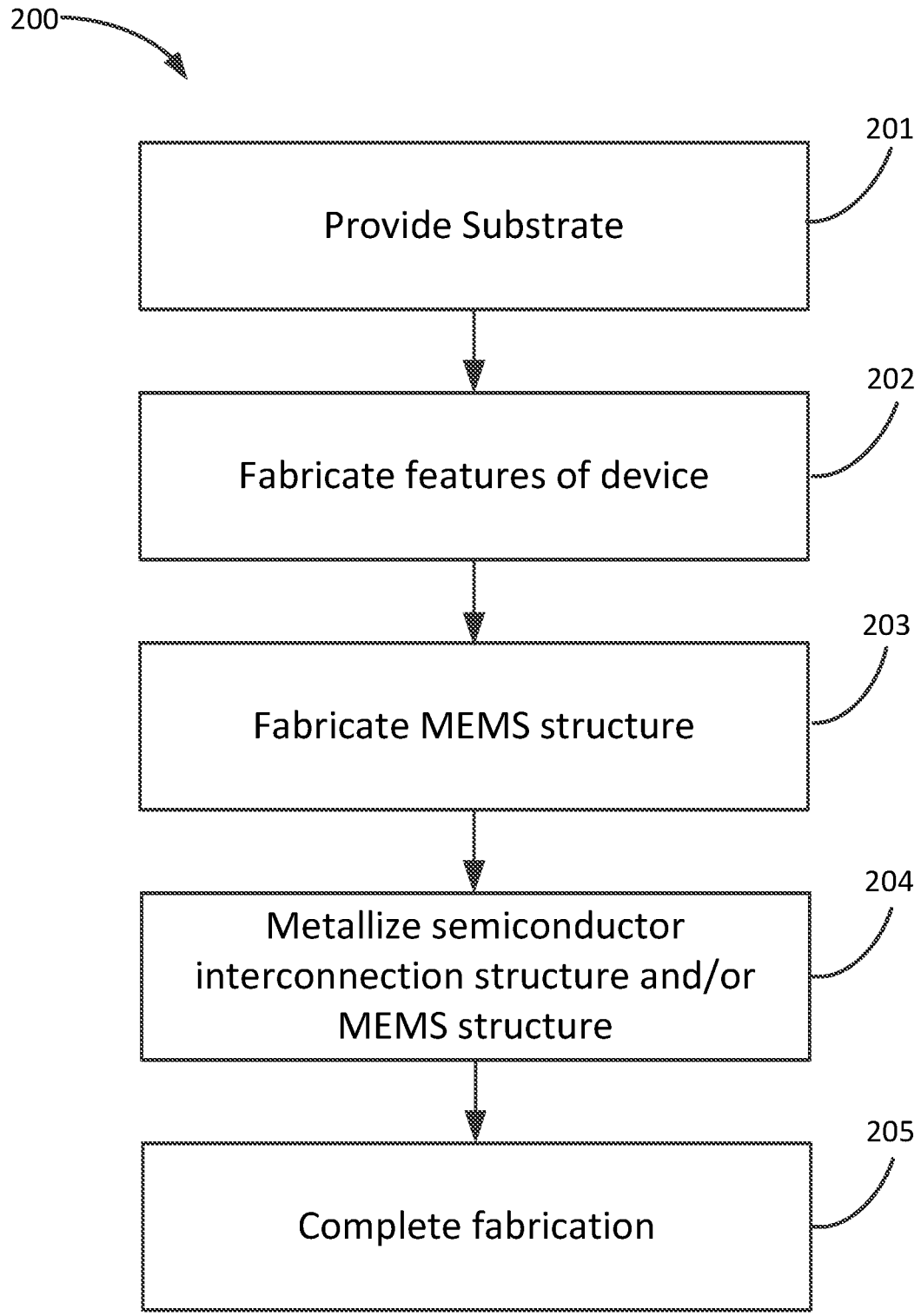
FIG. 2A is a flow chart illustrating methods of fabricating devices.

Methods of fabricating a device (e.g., 100) are illustrated in FIG. 2A and other flow charts as shown and described herein. Embodiments of a device 100 at various stages of fabrication is schematically illustrated in FIGS. 3A-3K and other figures as shown and described herein.

Step 201: Providing a Substrate

Figure 3A:
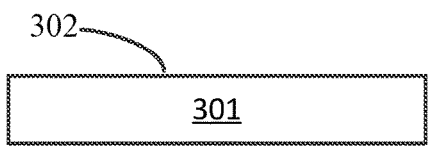
FIGS. 3A-3K schematically illustrate devices at various stages of fabrication.
Figure 3B:
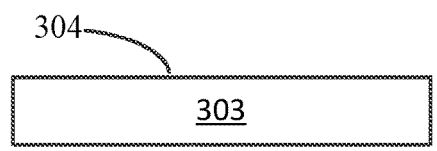
Figure 3C:
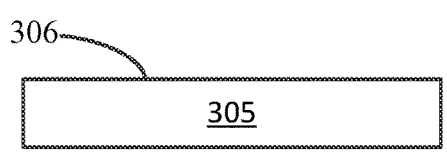
Figure 3D:
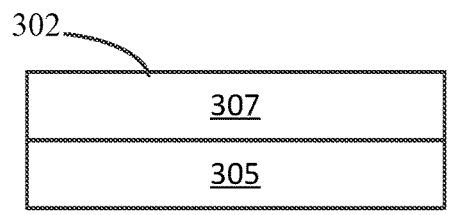

The method 200 begins at step 201 by providing substrate 301 having a surface 302, as schematically illustrated in FIG. 3A. The substrate 301 may be a semiconductor, such as silicon (e.g., substrate 303 FIG. 3B) having an exposed silicon surface 304. Alternately, the substrate 301 may be a silicon-on-insulator ("SOT"; as also schematically illustrated as substrate 303 FIG. 3B) die or wafer having an exposed silicon surface 304. In other embodiments, the substrate 301 may be a non-conductive substrate (such as substrate 305, for example) having a non-semiconductor surface 306, as schematically illustrated in FIG. 3C. If the substrate 301 does not have an exposed semiconductor surface, then step 201 may include depositing a layer 307 of semiconductor 305 having a semiconductor surface 302, such as silicon, as schematically illustrated in FIG. 3D.

Step 202: Fabricating Features on the Substrate

At step 202, various features of the device may be fabricated on or in the surface of the substrate. For illustrative purposes, the methods described below use a semiconductor substrate 301, although that is not a limitation of the disclosure, and indeed the process would also work with at least the substrates described above.

For example, step 202 may include fabrication of one or more contacts (e.g., 120, 121 etc.), one or more electrodes 123, and one or more structures 140, and/or one or more electronic circuits 122, by methods known in the art. A substrate 301 having some such features is schematically illustrated in FIG. 3E.

Figure 3E:
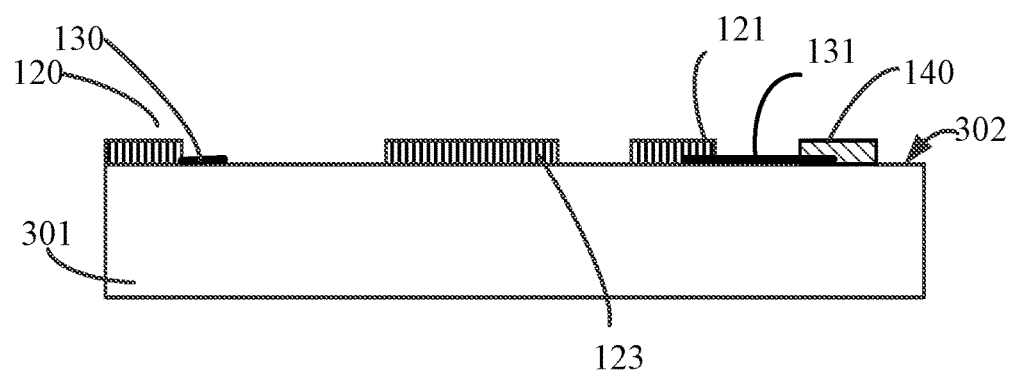

Step 202 may also include fabricating non-metalized interconnection structures on or in the substrate 301, as also schematically illustrated in FIG. 3E. Generally, one or more of the interconnection structures (which may also be referred-to as semiconductor interconnection structures) is a semiconductor structure to be replaced, at least in part, and/or layered with metal. Prior to replacing or layering an interconnection structure with metal, the interconnection structure may be conductive, such as doped silicon for example, or may be un-doped, such as un-doped silicon for example.

Figure 2B:
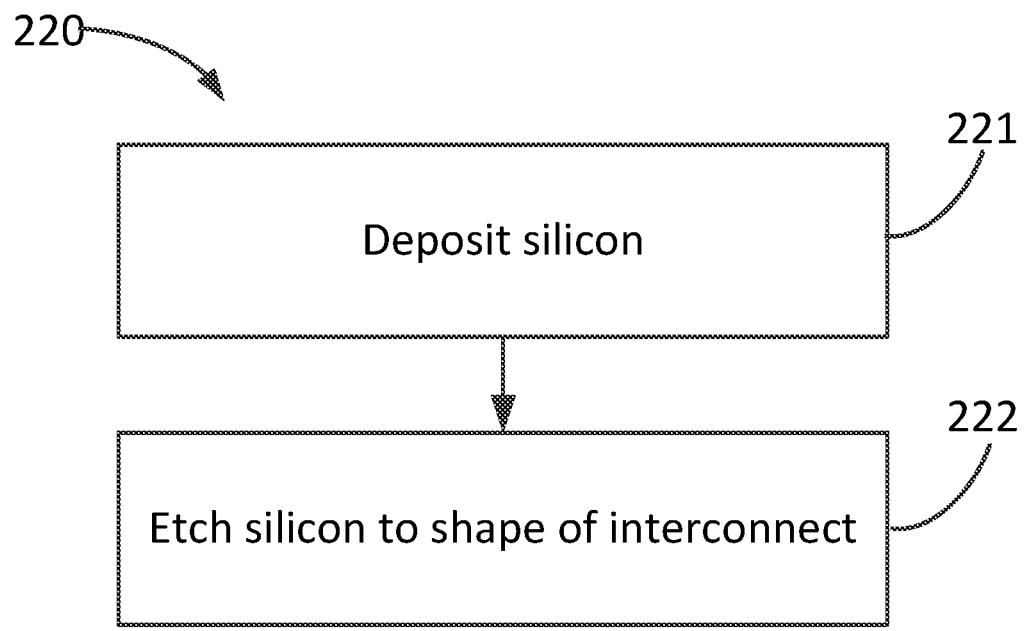
FIG. 2B is a flow chart illustrating an embodiment of a method of forming an interconnection.

If the surface of the substrate 301 is a semiconductor (e.g., silicon), the interconnection structures may be on or in the semiconductor surface 302. Embodiments of methods of forming such interconnecting structures are described below, and schematically illustrated by flow charts 220 in FIG. 2B, 230 in FIG. 2C, and 230 in FIG. 2D.

Interconnection Structures on the Substrate

Figure 4A:
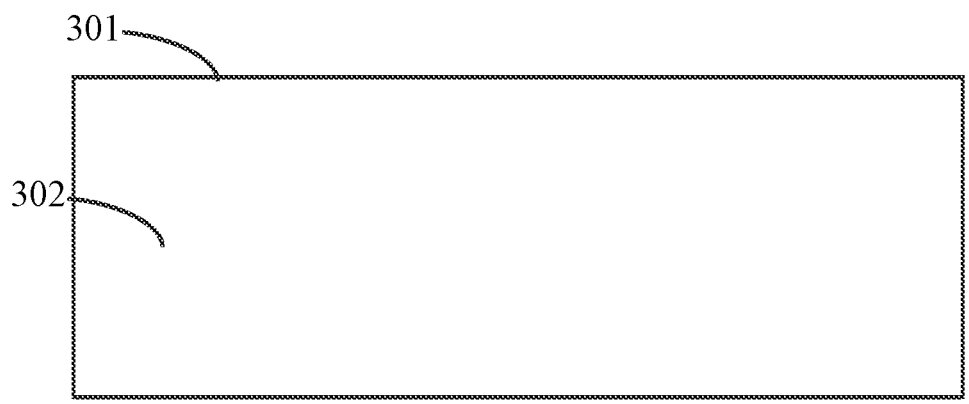
FIGS. 4A-4C schematically illustrate devices at various stages of fabricating interconnection structures on a substrate according to one embodiment.
Figure 4B:
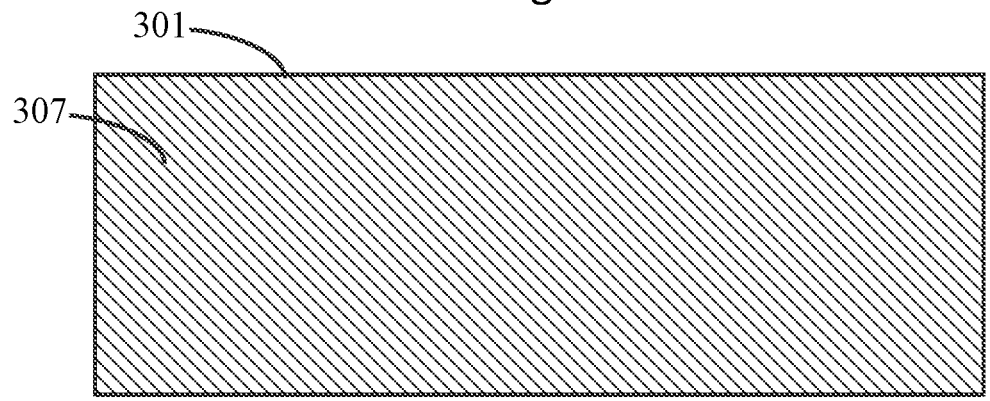
Figure 4C:
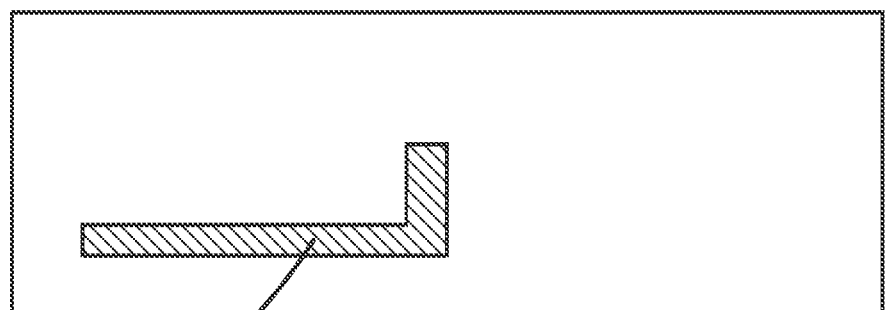
Figure 4D:
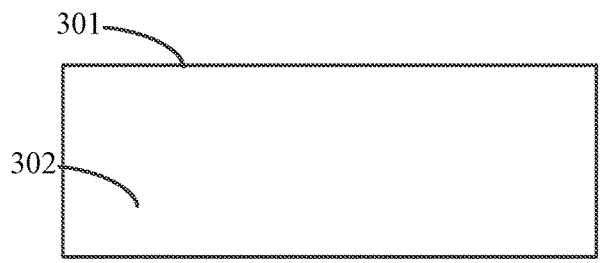
FIGS. 4D-4H schematically illustrate devices at various stages of fabricating interconnection structures on a substrate according to another embodiment.

Some embodiments fabricate one or more non-metalized interconnection structures (e.g., 410, which may also be referred to as semiconductor interconnection structures) on the surface 302 of, the substrate 301. An embodiment of a method of fabricating such non-metalized interconnection structures is illustrated by flow chart 220 in FIG. 2B, and a substrate at various stages of fabrication, is schematically illustrated in FIGS. 4A-4C.

The surface 302 may be silicon or a non-silicon material. At step 221, a layer of silicon (e.g., 307; FIG. 4B) may be deposited on the surface 302 of the substrate 301. At step 222, the layer of silicon 307 is etched to leave the desired non-metallized interconnection structures 410.

Figure 2C:
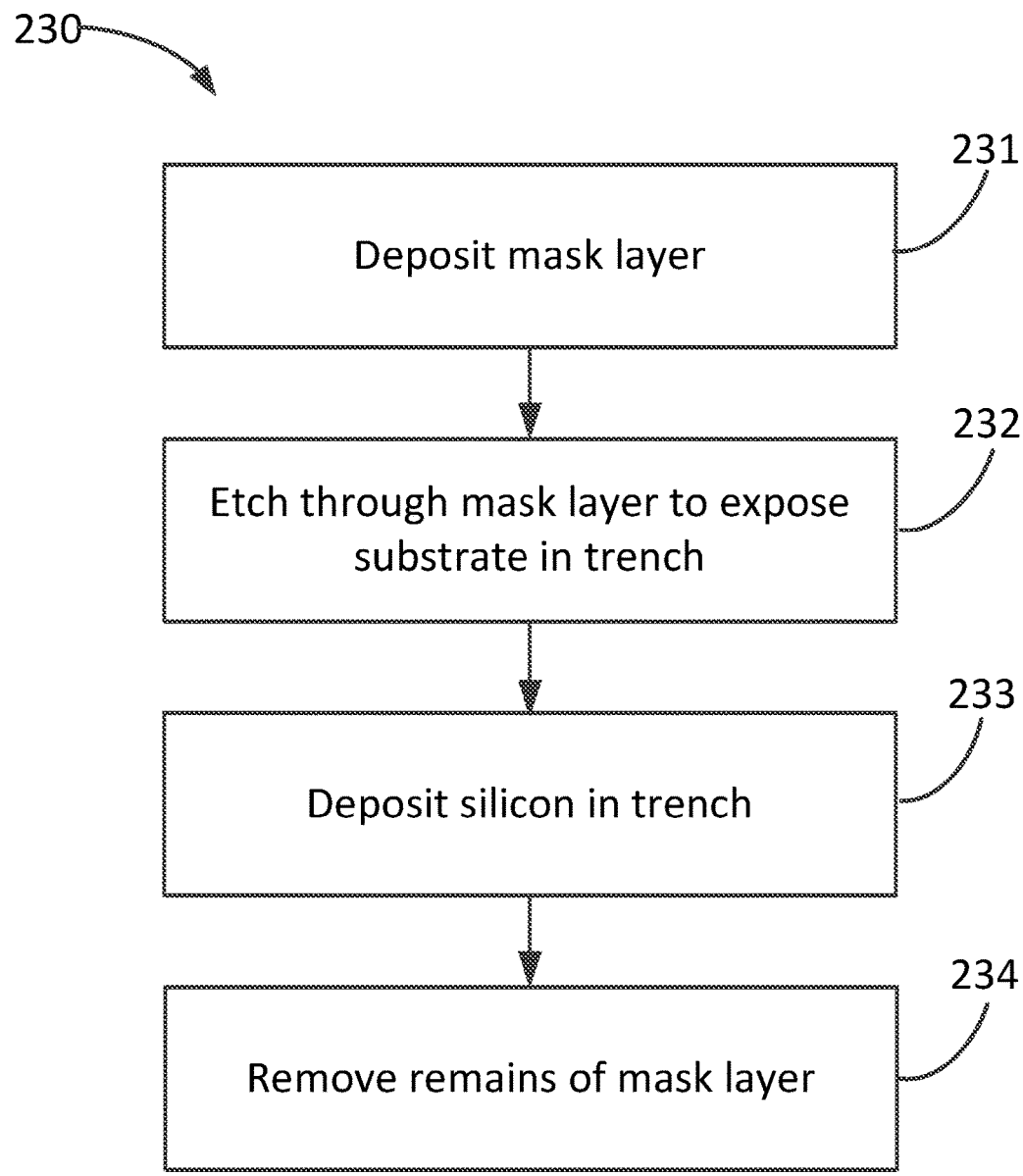
FIG. 2C is a flow chart illustrating another embodiment of a method of forming an interconnection.
Figure 2D:
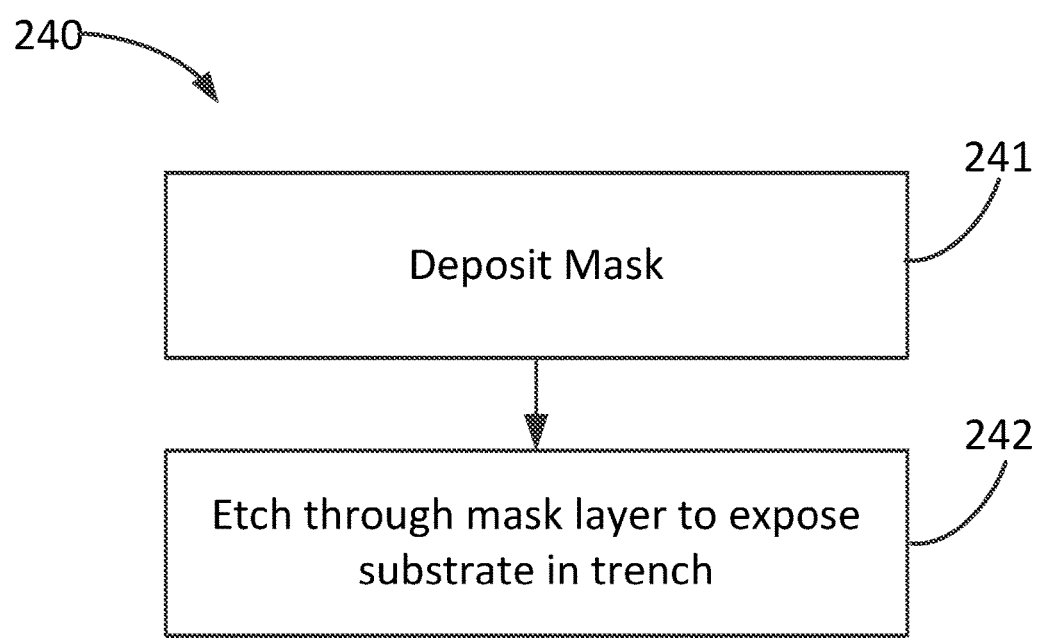
FIG. 2D is a flow chart illustrating another embodiment of a method of forming an interconnection.

Another embodiment of a method of fabricating such non-metalized interconnection structures on the substrate 302 is illustrated by flow chart 230 in FIG. 2C, and a substrate at various stages of fabrication, is schematically illustrated in FIGS. 4D-4H.

Figure 4E:
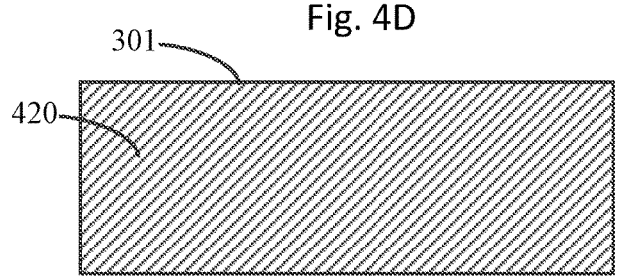

At step 231, a masking layer 420 may be deposited on the surface 302 of the substrate 301 (FIG. 4E).

Figure 4F:
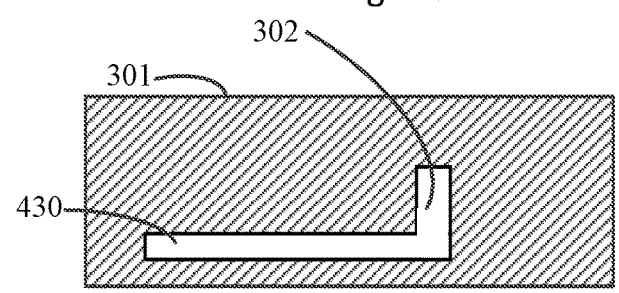

Then, as step 232, one or more trenches 430 are etched through the masking layer 420 (FIG. 4F). The etching exposes the surface 302 of the substrate 301 in the shape and location of the non-metalized interconnection structure 410 to be fabricated.

Figure 4G:
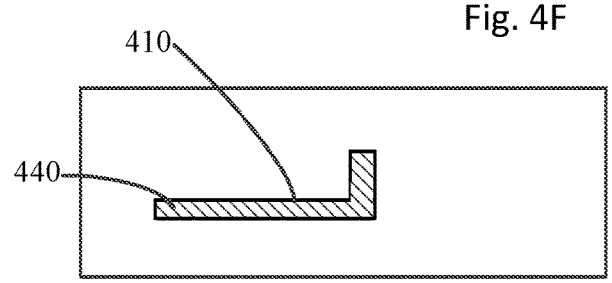

At step 233, silicon 440 is then deposited into the one or more trenches 430 to produce the non-metallized interconnection structure 410 on the surface 302 of the substrate 301, as schematically illustrated in FIG. 4G. In this embodiment, the non-metallized interconnection structure 410 stands on the surface 302 of the substrate 301, and at least one of its surfaces (410T) is exposed.

Figure 4H:
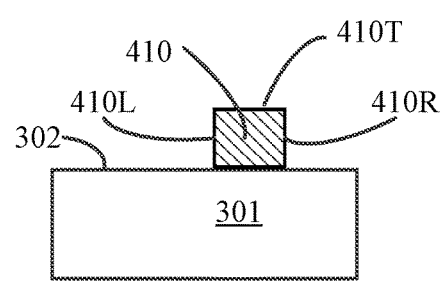

Some embodiments also remove some or all of the remains of the masking layer 420, at step 234, in which case two or more of the surfaces (410T, 410L and 410R) of the non-metallized interconnection structure 410 are exposed, as schematically illustrated in FIG. 4H. Consequently, in the metallizing step (described below), one (e.g., 410T) or more of the surfaces (410T, 410L and 410R) of the non-metallized interconnection structure 410 may be metallized (see FIG. 6E for example), depending on how much of the structure 410 is exposed.

Interconnection Structures in (at the Surface of) the Substrate

Figure 5A:
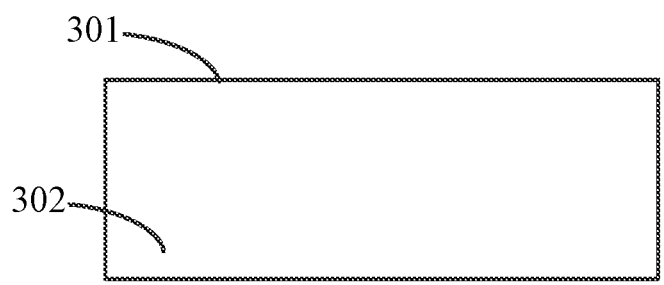
FIGS. 5A-5B schematically illustrate devices at various stages of fabricating interconnection structures on a substrate according to another embodiment.
Figure 5B:
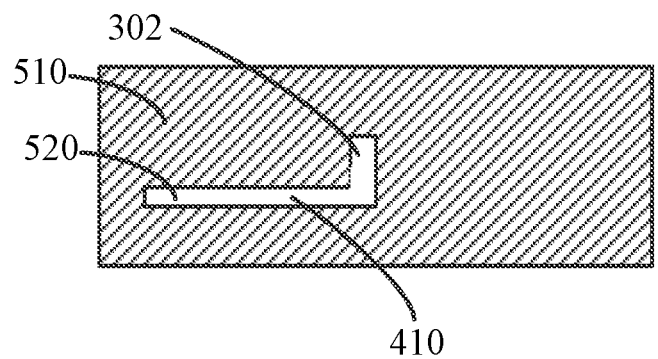

Another embodiment fabricates non-metalized (or pre-metallized) interconnection structure 410 in, or at the surface 302 of, the substrate 301. An embodiment of a method of fabricating such interconnections is illustrated by flow chart 240 in FIG. 2D, and a substrate at various stages of fabrication, is schematically illustrated in FIGS. 5A-5B.

A mask layer 510 is deposited on the substrate at step 241.

The mask layer 510 is etched at step 242 to define the shape and location of the interconnection structure 410. More specifically, the mask layer 510 may cover other features of the substrate (e.g., contacts, etc.), but has an opening (or trench) 520 that defines the shape and location interconnection structure 410, where the silicon surface 302 is exposed through the opening 520. In this embodiment, the semiconductor (e.g., silicon) of the surface 302 exposed through the opening 520 may be referred to as the semiconductor interconnection structure 410, and may be described as being the surface of, or at the surface of, the substrate 301, and when metallized, the resulting metallized structure may be described as being the surface of, or at the surface of, the substrate 301. Prior to metallizing, that semiconductor interconnection structure 410 may be conductive, for example because it is doped, before or after deposition of the mask layer 510, or may be un-doped.

The metalized interconnection structure is then formed at the metallization step, described below.

Step 203: Forming a MEMS Structure

A MEMS structure is formed at step 203, although fabrication of some or all of the MEMS structure may also be fabricated in step 202. However, the MEMS structure is not to be confused with interconnection structures. Although interconnection structures may be coupled to a MEMS structure, interconnection structures are distinct from MEMS structures. For example, a device may have an interconnection structure without also having a MEMS structure. A device having a MEMS structure may also have an interconnection structure, even though the interconnection structure is not part of the MEMS structure.

The MEMS structure may be any of a variety of MEMS structures as known in the art, and is not limited to switches and cantilevered accelerometers 110 as schematically illustrated in FIGS. 1A and 1B. For example, the MEMS structure 110 could also be any of a variety of MEMS devices as known in the art, such as an accelerometer in which a beam is suspended to move parallel to the surface of the substrate in response to acceleration, or a Coriolis gyroscope in which a beam is suspended to move parallel to the surface of the substrate in response to rotation, a microphone in which the beam is a movable diaphragm, or pressure sensor in which the beam is a movable diaphragm, to name but a few examples.

Figure 2E:
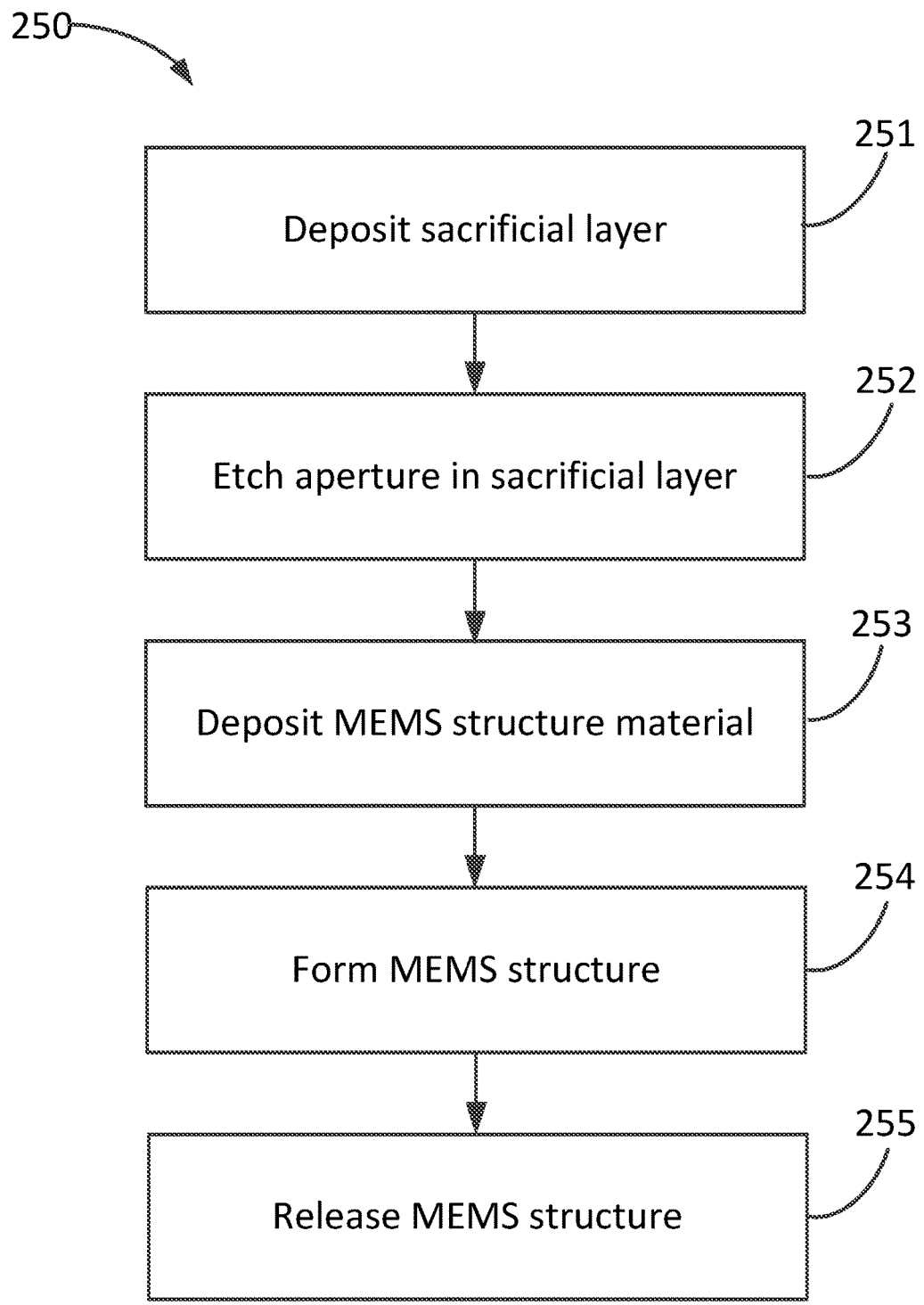
FIG. 2E is a flow chart illustrating an embodiment of a method of forming a MEMS structure.

An embodiment of a method of fabricating a MEMS structure, pursuant to step 203, is illustrated in additional detail by the flow chart 250 in FIG. 2E. Although the MEMS structure may be described as being on the substrate 301, this does not required that the MEMS structure (e.g., anchor 112) be in direct physical contact with the substrate 301, since various embodiments may allow intervening layers or materials.

Figure 3F:
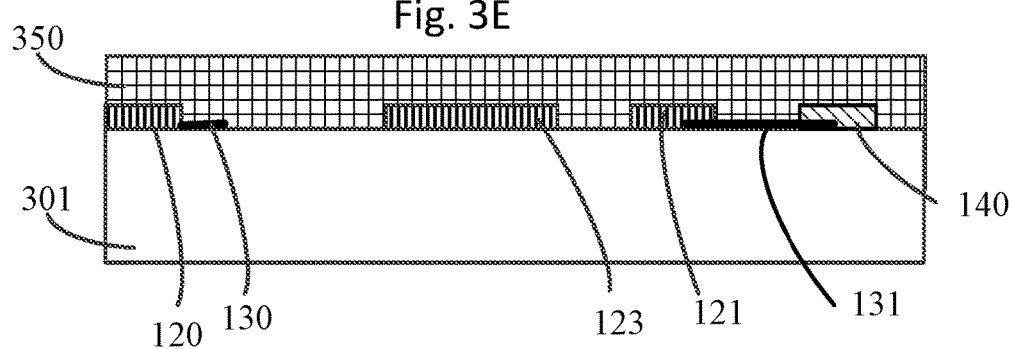

Fabrication of a MEMS structure may include depositing (step 251) a sacrificial layer 350 over the surface of the substrate 301, and any other features already on the substrate, if any are present, such as contacts (e.g., 120), electrodes (e.g., 123), circuits 122, mask layer 510 (in which case the sacrificial layer may also fill-in trench 520), and exposed surface 302, as schematically illustrated in FIG. 3F for example. The sacrificial layer 350 may be a sacrificial oxide layer, for example.

Figure 3G:
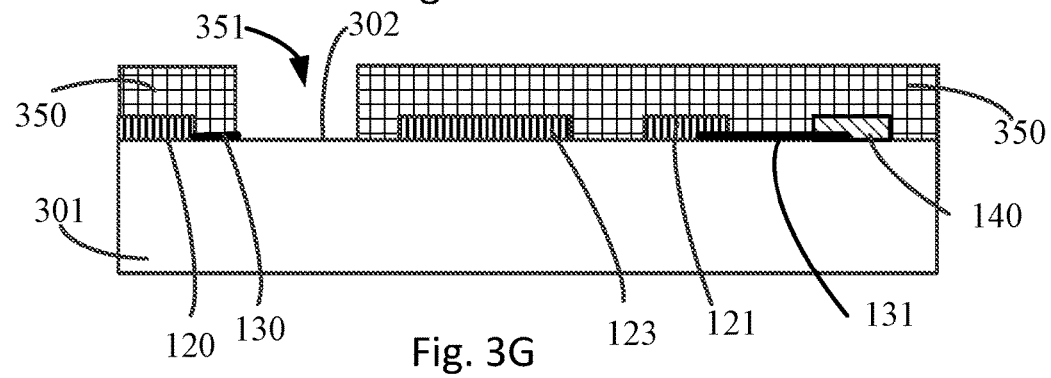

The method also includes etching an aperture 351 the sacrificial layer 350, at step 252, to expose the surface 302 of the substrate 301 (as schematically illustrated in FIG. 3G).

Figure 3H:
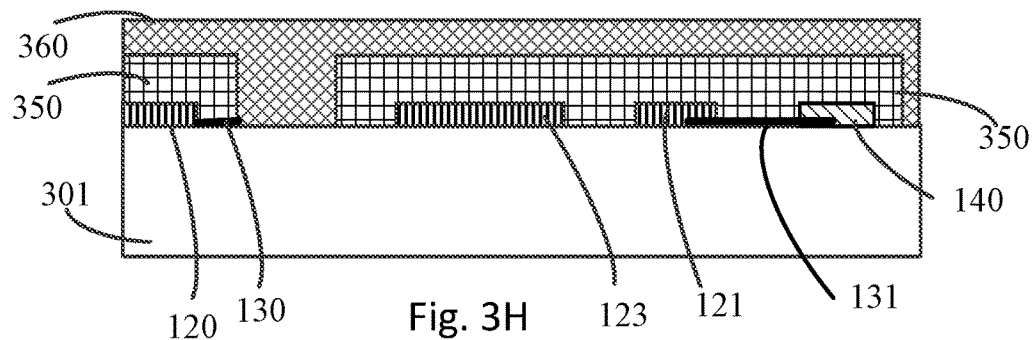
Figure 3I:
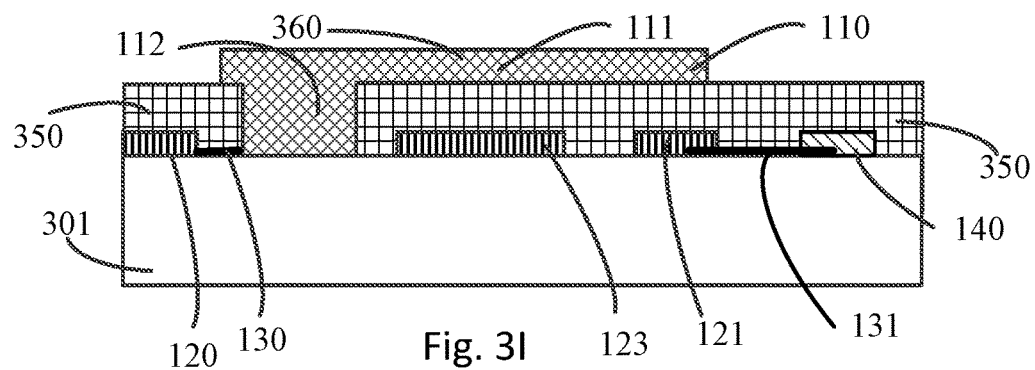

Next, at step 253, a layer 360 of MEMS structure material (e.g., polysilicon layer) 360 may be deposited on the sacrificial layer 350, the MEMS structure material 360 filling the aperture 351 to form an anchor 112, and covering (laying on) the sacrificial layer 350 (as schematically illustrated in FIG. 3H). The MEMS structure material 360 is etched at step 254 to form the shapes of the MEMS structure (as schematically illustrated in FIG. 3I), such as MEMS structure 110 for example. As schematically illustrated in FIG. 3I, portions of the MEMS structure material 360 are etched away to leave the MEMS structure 110 coupled to the substrate 101 by the anchor 112.

Figure 3J:
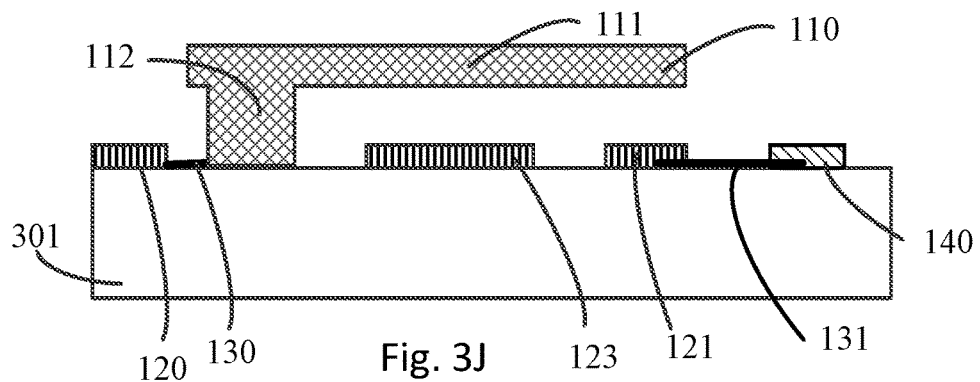

Then, the sacrificial layer 350 is removed at step 255. As a result of the removal of the sacrificial layer 350, the MEMS structure may be released, in that the MEMS structure 111 is then movable with respect to the substrate 101, while remaining secured to the substrate 301 by anchor 112, as schematically illustrated in FIG. 3J. The MEMS structure 100 remains movable relative to the substrate during the metallizing process described below.

Step 204: Metallizing Features of a Device

After the MEMS device is formed, the MEMS structure, and/or the interconnection structures, are metallized at step 204, and may be metallized simultaneously.

Metallizing MEMS structures can be beneficial by adding weight to a movable member (e.g., beam 111, for example), such as a suspended beam in an accelerometer or gyroscope, for example. The method of FIG. 6A may be used to metallize the MEMS structure.

Some embodiments metallize multiple surfaces and sides of a MEMS structure. For example, FIG. 6F schematically illustrates a beam 111 of a MEMS structure, the beam having four sides (111T, 111R, 111L and 111B), all of which are exposed to reacting gas or gasses and include a metal layer 650 on, or in, the exposed sides. The surfaces of sides 111T, 111R, 111L and 111B may be described as circumferential surfaces, in that they surround the beam 111, as opposed for example to being an interior surface of the beam 111 such as a surface of a cavity or an aperture in the beam, for example. Metallizing one or more of such circumferential surfaces provides simpler fabrication, such as fewer steps and mask layers, than would be required to first form an aperture or cavity in the beam and then metallizing an interior surface of such aperture or cavity.

Other embodiments metallize fewer than four sides of a MEMS structure. For example, some embodiments metalize the MEMS structure 110 before the MEMS structure is released at step 255. In such embodiments, only some portions of the MEMS structure 110 may be metalized (e.g., surface 111T in FIG. 2F), since other portions of the MEMS structure (e.g., surface 111B in FIG. 2F) may remain covered by, e.g., sacrificial layer 350. Other embodiments metalize the MEMS structure 110 after the MEMS structure is released, with the result that previously covered portions of the MEMS structure (e.g., surface 111B) are metalized.

Some embodiments metalize the interconnection structures (e.g., 410, etc.). After metallization of interconnection structures, the resistance of those interconnection structures may be reduced as compared to the same interconnection structures prior to metallization. The resistance of interconnections may be specified in terms of sheet resistance, in ohms per square and commonly designated as "Ω/sq." For example, sheet resistance is commonly used to characterize thin films that are nominally uniform in thickness, such as materials made by semiconductor doping. For example, a doped semiconductor interconnection structure may have a sheet resistance of 20 Ω/sq. before metallization, and an un-doped semiconductor interconnection structure may have an even higher sheet resistance.

However, such a semiconductor interconnection structure may have a sheet resistance of equal-to or less-than 20 Ω/sq. after metallization. Indeed, in some embodiments, a semiconductor interconnection structure may have a sheet resistance equal-to or less-than 15 Ω/sq., 10 Ω/sq., 5 Ω/sq., or even less than 1 Ω/sq., after metallization.

Figure 6A:
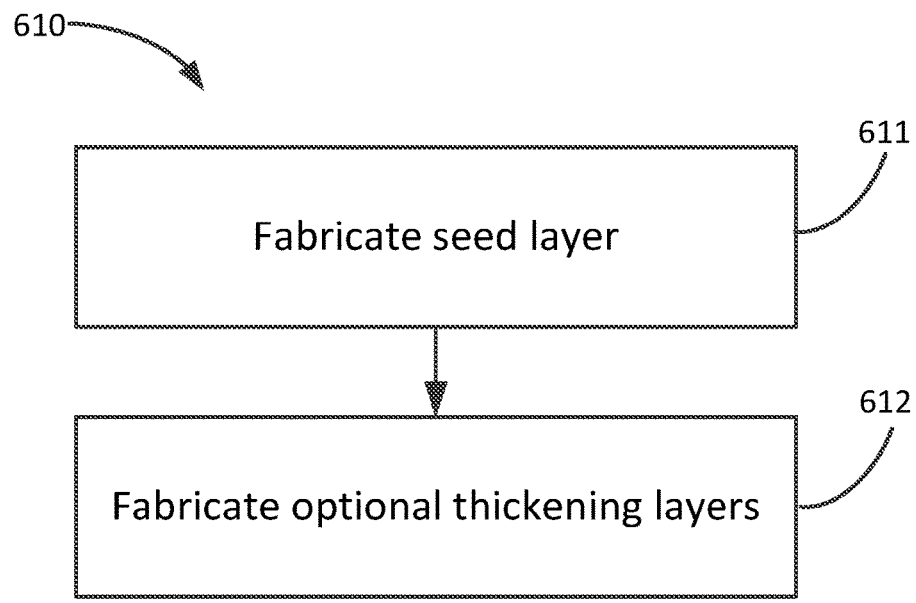
FIG. 6A is a flow chart illustrating an embodiment of a method of metallizing a structure.
Figure 6B:
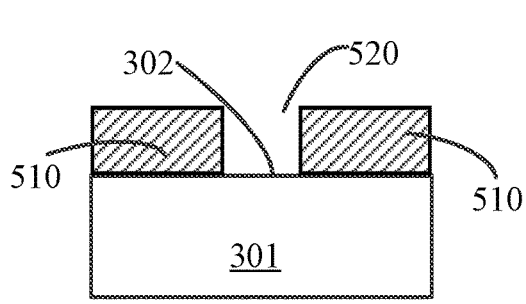
FIGS. 6B-6G schematically illustrate metallized structures.
Figure 6C:
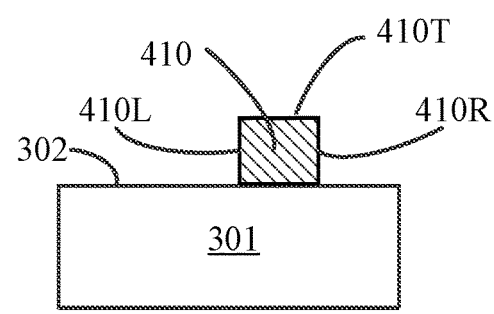
Figure 6D:
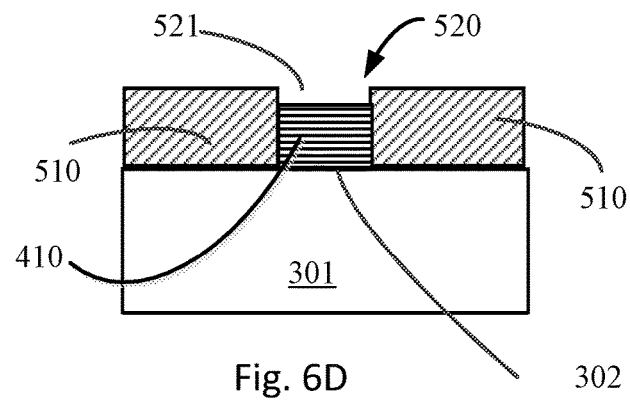
Figures 6E, 6F:
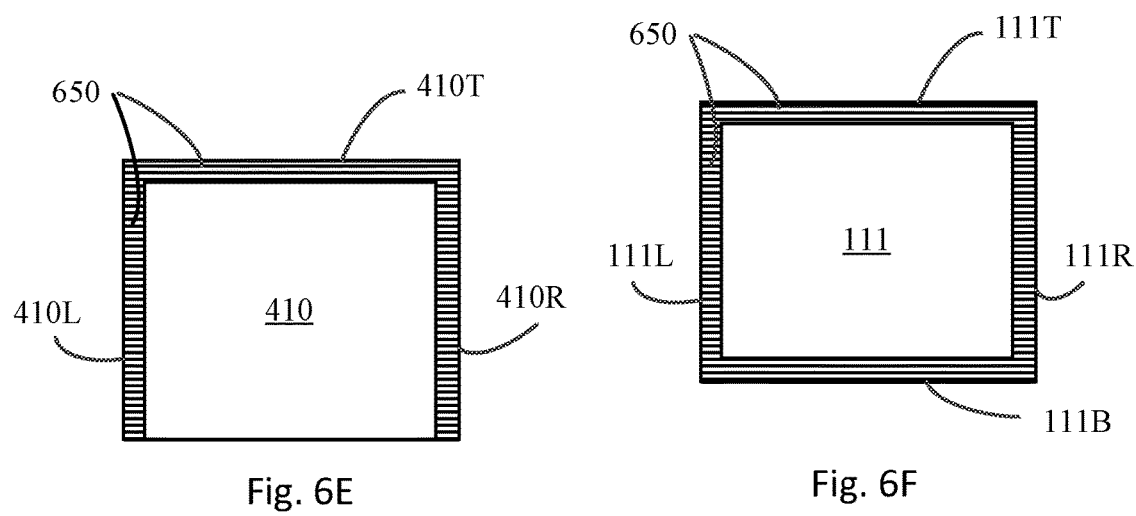

Embodiments of methods of metalizing interconnections and/or MEMS structures are shown in the flow chart 610 of FIG. 6A, and further schematically illustrated in FIG. 6B-6G.

Generally, the method 600 of flow chart 610 forms a seed layer of tungsten (step 611), and may optionally form one or more additional, or thickening, layers on the seed layer (step 612). Various embodiments of the methods represented by the flow chart 610 may include exposing the structures to be metallized—e.g., MEMS structures (e.g. 110) and/or interconnection structures (e.g., 410)—to a gas including metal atoms, or molecules including metal atoms. The metal atoms may be, but are not limited to, tungsten or molybdenum, to name just a few examples. Such a gas may be referred-to as a reacting gas.

The description below describes metallization of an interconnection structure, with the understanding that the same chemistry and process applies to metallization of MEMS structures (e.g., MEMS structure 111 for example).

Fabrication of the seed layer in step 611 may be performed in a variety of ways. Some embodiments replace some, or all, of the structure to be metallized with metal. As such, an act of replacing a semiconductor interconnection structure with a conductive metal interconnection structure does not necessarily require replacing every atom of a semiconductor interconnection structure with a conductive metal. Indeed, as described below, in some embodiments the chemical reaction is self-limiting.

In a first embodiment, step 611 exposes the structure to metalized (in this example, interconnection structures) to gaseous tungsten hexafluoride ($WF_6$) at a temperature between 300-500° C. (e.g., less than 500° C.), and some embodiments may operate at less than 300° C. For example, the interconnection structures may be an exposed semiconductor surface 302 as described above and schematically illustrated in FIG. 6B, or a semiconductor structure 410 with exposed surfaces (e.g., 410T, 410L, 410R) as described above and schematically illustrated in FIG. 6C. The metallization process is described below using a semiconductor structure 410 with exposed surfaces (e.g., 410T, 410L, 410R; FIG. 6C), with the understanding that the process would operate on substantially the same way with other embodiments of interconnection structures and/or MEMS structures. For example, the surface 302 of substrate 301 may be metallized via trench 520 as schematically illustrated in FIG. 6D.

The silicon in the interconnection structures acts as a reducing agent and reacts with $WF_6$ to produce solid tungsten and silicon fluoride gas ($SiF_4$). In some embodiments, the tungsten precipitates out of the gaseous $WF_6$ to form a thin layer 650 (which may be referred-to as the "seed layer" 650) on the surface of the interconnection 410, as the silicon reacts with the fluorine to become gaseous $SiF_4$. This is carried out according to the equation below:

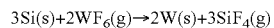

$$3Si(s)+2WF_6(g)\rightarrow 2W(s)+3SiF_4(g)$$

In other embodiments, the atoms of tungsten displace atoms of silicon within the interconnection structure 410, such that the tungsten atoms are infused into the structure 410 and become part of the structure. Consequently, at least part of the interconnection structure 410 has been replaced with metal to form a metallized interconnection, such as interconnection 135 of FIG. 1A, for example.

The chemical reaction of this embodiment is self-limiting because, without other reducing agents, the gaseous $WF_6$ cannot continue to form layers of tungsten at, or into, the exposed silicon (e.g., at 410T, 410L, 410R) of the interconnection 410.

Another embodiment of step 611 exposes the interconnection structures 410 to both $WF_6$ and hydrogen gas ($H_2$). In this embodiment, the hydrogen works as a reducing agent, forming $SiHF_3$ and solid tungsten (W) according to the equation below:

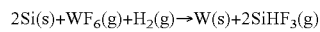

$$2Si(s)+WF_6(g)+H_2(g)\rightarrow W(s)+2SiHF_3(g)$$

Yet another embodiment of step 611 exposes the interconnection structures 410 to both $WF_6$ and silane ($SiH_4$). In this embodiment, $WF_6$ is reduced with $SiH_4$ to form solid tungsten. $SiH_4$ works similarly to hydrogen gas in the embodiment disclosed above. This method produces solid tungsten, SiHF$_3$, and hydrogen gas according to the equation below:

$$WF_6(g)+2SiH_4(g) \rightarrow W(s)+3H_2(g)+2SiHF_3(g)$$

Figure 6G:
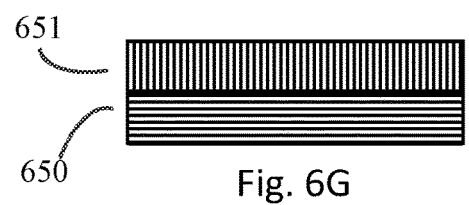

In some embodiments, after the seed layer 650 is formed at step 611, the method 600 optionally fabricates one or more additional layers of tungsten on top of the seed layer 650, as step 612. An additional layer 651 of tungsten and a seed layer 650 is schematically illustrated in FIG. 6G. The seed layer 650 of FIG. 6G could be any of the seed layers 650 disclosed herein, such as seed layer 650 on interconnection 410, or seed layer 650 on MEMS structure 111, for example.

For example, some embodiments expose the seed layer 650 to gaseous WF$_6$. The gaseous WF$_6$ can react with the solid tungsten to precipitate additional tungsten from the gas. The additional solid tungsten is deposited on the surface tungsten according to the following equation:

$$W^*(s)+WF_6(g) \rightarrow W^*F_6(g)+W(s)$$

where the * denotes the reaction site where the tungsten is deposited.

Other embodiments expose the seed layer to gaseous WF$_6$ by including hydrogen gas (H$_2$) with the gaseous WF$_6$. The hydrogen gas acts as a reducing agent, reducing the tungsten in gaseous WF$_6$ to produce solid tungsten and hydrogen fluoride gas (HF). This reaction is carried out according to the following equation:

$$3H_2(g)+WF_6(g) \rightarrow 6HF(g)+W(s)$$

As mentioned above, a reacting gas may also include molybdenum ("Mo"), and the process 600 proceeds substantially the same way as described above for tungsten. For example, at step 611 the silicon in the interconnection structures acts as a reducing agent and reacts with MoF$_6$ to produce solid molybdenum and silicon fluoride gas (SiF$_4$). In some embodiments, the molybdenum precipitates out of the gaseous MoF$_6$ to form seed layer 650 on the surface of the interconnection 410, as the silicon reacts with the fluorine to become gaseous SiF$_4$. This is carried out according to the equation below:

$$3Si(s)+2MoF_6(g) \rightarrow 2Mo(s)+3SiF_4(g)$$

Another embodiment of step 611 exposes the interconnection structures 410 to both MoF$_6$ and hydrogen gas (H$_2$). In this embodiment, the hydrogen works as a reducing agent, forming SiHF$_3$ and solid molybdenum according to the equation below:

$$2Si(s)+MoF_6(g)+H_2(g) \rightarrow Mo(s)+2SiHF_3(g)$$

Yet another embodiment of step 611 exposes the interconnection structures 410 to both MoF$_6$ and silane (SiH$_4$). In this embodiment, MoF$_6$ is reduced with SiH$_4$ to form solid molybdenum. SiH$_4$ works similarly to hydrogen gas in the embodiment disclosed above. This method produces solid molybdenum, SiHF$_3$, and hydrogen gas according to the equation below:

$$MoF_6(g)+2SiH_4(g) \rightarrow Mo(s)+3H_2(g)+2SiHF_3(g)$$

Step 205: Additional Steps

Figure 3K:
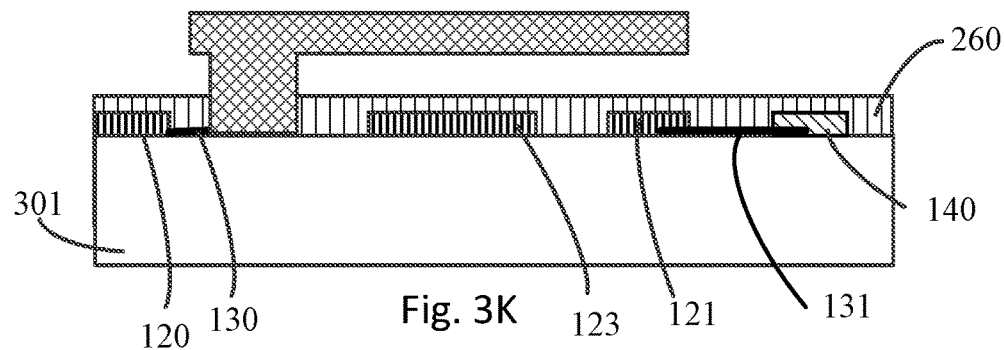

After the interconnections are metallized at step 204, one or more additional fabrication steps may be performed at step 205. For example, in some embodiments, a passivating layer 260, such as an oxide layer for example, is formed over the metallized interconnections (e.g. 130, 131), as schematically illustrated in FIG. 3K.

In embodiments that include a mask layer 510, the trench 520 in the mask layer may be filled-in to create a passivating layer 260. For example, if the trench 520 includes, but is not completely filled by, metallized interconnection 410, then space 521 remaining in the trench 520 may be filled with passivating material, such as material of the mask layer 510 for example.

In some embodiments, in which the substrate 301 is part of a wafer having many such substrates, the wafer may be diced to cut the substrates into individual devices 100.

Various embodiments of the present invention may be characterized by the potential claims listed in the paragraphs following this paragraph (and before the actual claims provided at the end of this application). These potential claims form a part of the written description of this application. Accordingly, subject matter of the following potential claims may be presented as actual claims in later proceedings involving this application or any application claiming priority based on this application. Inclusion of such potential claims should not be construed to mean that the actual claims do not cover the subject matter of the potential claims. Thus, a decision to not present these potential claims in later proceedings should not be construed as a donation of the subject matter to the public.

Without limitation, potential subject matter that may be claimed (prefaced with the letter "P" so as to avoid confusion with the actual claims presented below) includes:

P1. A method of fabricating a micromachined device having a metal interconnection structure, comprising:
fabricating a substrate having at least one semiconductor interconnection structure, the semiconductor interconnection structure having an electrical resistance;
fabricating a micromachined structure on the substrate; and
after fabricating the micromachined structure, replacing the semiconductor interconnection structure with a conductive metal interconnection structure having an electrical resistance that is lower than the electrical resistance of the semiconductor interconnection structure, wherein replacing the semiconductor interconnection structure with a conductive metal interconnection structure comprises exposing the semiconductor interconnection structure to a reacting gas, wherein the reacting gas comprises molybdenum, and the conductive metal interconnection structure comprises molybdenum.

P2. The method of fabricating a micromachined device having a metal interconnection structure according to P1, wherein the reacting gas comprises MoF6.

P3. The method of fabricating a micromachined device having a metal interconnection structure according to P3, wherein the reacting gas comprises SiH4.

P11. A MEMS device comprising:
a substrate having a surface;
a movable MEMS structure movably suspended from the substrate;
a metallized interconnection structure, the metallized interconnection structure comprising a molybdenum-infused semiconductor and having a sheet resistance of less than 5 Ω/sq.

P12. The MEMS device of P11, wherein the movable MEMS structure includes at least one surface comprising molybdenum.

The embodiments of the invention described above are intended to be merely exemplary; numerous variations and modifications will be apparent to those skilled in the art. All such variations and modifications are intended to be within the scope of the present disclosure and as defined in any appended claims.

What is claimed is:

1. A method of fabricating a micromachined device having a conductive metal interconnection structure, comprising:
fabricating a substrate having a semiconductor interconnection structure, the semiconductor interconnection structure having an electrical resistance;
fabricating a micromachined structure on the substrate; and
after fabricating the micromachined structure, metallizing the semiconductor interconnection structure to form a conductive metal interconnection structure having an electrical resistance that is lower than the electrical resistance of the semiconductor interconnection structure.

2. The method of claim 1, further comprising, prior to metallizing the semiconductor interconnection structure, releasing the micromachined structure, so that the micromachined structure is movable relative to the substrate and remains movable relative to the substrate during metallizing the semiconductor interconnection structure.

3. The method of claim 1, wherein metallizing the semiconductor interconnection structure to form the conductive metal interconnection structure comprises:
forming a seed layer of metal on the semiconductor interconnection structure in which semiconductor atoms within the semiconductor interconnection structure are replaced by metal.

4. The method of claim 1, wherein metallizing the semiconductor interconnection structure to form the conductive metal interconnection structure occurs at a temperature of less than 500 degrees Celsius.

5. The method of claim 1, wherein metallizing the semiconductor interconnection structure to form the conductive metal interconnection structure occurs at a temperature of less than 300 degrees Celsius.

6. The method of claim 1, wherein the conductive metal interconnection structure has a sheet resistance of less than 10 $\Omega$/sq.

7. The method of claim 1, wherein the conductive metal interconnection structure has a sheet resistance of less than 1 $\Omega$/sq.

8. The method of claim 1, wherein metallizing the semiconductor interconnection structure to form the conductive metal interconnection structure comprises exposing the semiconductor interconnection structure to a reacting gas.

9. The method of claim 8, wherein the reacting gas comprises tungsten, and the conductive metal interconnection structure comprises tungsten.

10. The method of claim 8, wherein the reacting gas comprises $WF_6$.

11. The method of claim 10, wherein the reacting gas comprises $SiH_4$.

12. The method of claim 1, further comprising covering the conductive metal interconnection structure with a passivating layer.

13. A microelectromechanical systems (MEMS) device comprising:
a substrate having a surface;
a movable MEMS structure movably suspended from the substrate;
a metallized interconnection structure, the metallized interconnection structure comprising a metal-infused semiconductor and having a sheet resistance of less than 5 $\Omega$/sq.

14. The MEMS device of claim 13, wherein the metal-infused semiconductor is a tungsten-infused semiconductor.

15. A method of fabricating a micromachined device, comprising:
fabricating a micromachined structure on a substrate;
fabricating at least one semiconductor interconnection structure at a surface of the substrate; and
simultaneously metallizing the micromachined structure and the at least one semiconductor interconnection structure to form a metallized micromachined structure and at least one conductive metal interconnection structure.

16. The method of fabricating a micromachined device according to claim 15, wherein the micromachined structure is movable with respect to the substrate during metallizing the micromachined structure.

17. The method of fabricating a micromachined device according to claim 16, wherein the micromachined structure is a beam of a MEMS device, and metallizing the micromachined structure comprises metallizing four sides of the beam.

18. The method of fabricating a micromachined device according to claim 15, further comprising:
covering the at least one conductive metal interconnection structure with a passivating layer.

19. The method of fabricating a micromachined device according to claim 15, wherein simultaneously metallizing the micromachined structure and the at least one semiconductor interconnection structure comprises:
forming a seed layer of metal on the micromachined structure and the at least one semiconductor interconnection structure in which semiconductor atoms within the micromachined structure and the at least one semiconductor interconnection structure are replaced by metal.

20. The method of claim 8, wherein the reacting gas comprises molybdenum, and the conductive metal interconnection structure comprises molybdenum.

21. The method of claim 20, wherein the reacting gas comprises $MoF_6$.

22. The method of claim 21, wherein the reacting gas comprises $SiH_4$.

23. The MEMS device of claim 13, wherein the metallized interconnection structure has a sheet resistance of less than 1 $\Omega$/sq.

24. The MEMS device of claim 13, wherein the metal-infused semiconductor is a molybdenum-infused semiconductor.

25. The MEMS device of claim 13, further comprising:
a passivating layer on the metallized interconnection structure.

26. The method of fabricating a micromachined device according to claim 15, wherein simultaneously metallizing the micromachined structure and the at least one semiconductor interconnection structure comprises exposing the micromachined structure and the at least one semiconductor interconnection structure to a reacting gas.

27. The method of fabricating a micromachined device according to claim 26, wherein the reacting gas comprises tungsten, and the at least one conductive metal interconnection structure comprises tungsten.

28. The method of fabricating a micromachined device according to claim 27, wherein the reacting gas comprises $WF_6$.

29. The method of fabricating a micromachined device according to claim 28, wherein the reacting gas comprises $SiH_4$.

30. The method of fabricating a micromachined device according to claim 26, wherein the reacting gas comprises molybdenum, and the at least one conductive metal interconnection structure comprises molybdenum.

31. The method of fabricating a micromachined device according to claim 30, wherein the reacting gas comprises $MoF_6$.

32. The method of fabricating a micromachined device according to claim 31, wherein the reacting gas comprises $SiH_4$.

33. A method of fabricating a micromachined device, comprising:
   fabricating a micromachined structure on a substrate; and
   metallizing the micromachined structure, wherein metallizing the micromachined structure comprises forming a seed layer of metal on the micromachined structure in which semiconductor atoms within the micromachined structure are replaced by metal.

34. The method of fabricating a micromachined device according to claim 33, wherein the micromachined structure is movable with respect to the substrate during metallizing the micromachined structure.

35. The method of fabricating a micromachined device according to claim 34, wherein the micromachined structure is a beam of a MEMS device, and metallizing the micromachined structure comprises metallizing four sides of the beam.

36. The method of fabricating a micromachined device according to claim 33, further comprising fabricating at least one semiconductor interconnection structure at a surface of the substrate, wherein metallizing the micromachined structure comprises simultaneously metallizing the at least one semiconductor interconnection structure to form a conductive metal interconnection structure including forming the seed layer of metal on the at least one semiconductor interconnection structure in which semiconductor atoms within the at least one semiconductor interconnection structure are replaced by metal.

37. The method of fabricating a micromachined device according to claim 36, further comprising:
   covering the conductive metal interconnection structure with a passivating layer.

38. The method of fabricating a micromachined device according to claim 33, wherein the seed layer comprises tungsten.

39. The method of fabricating a micromachined device according to claim 33, wherein the seed layer comprises molybdenum.

* * * * *